United States Patent [19]

Clark

[11] Patent Number: 5,043,656
[45] Date of Patent: Aug. 27, 1991

[54] ELECTRICAL TEST PROBE

[76] Inventor: Oren S. Clark, 40 Ridge St., Greenwich, Conn. 06830

[21] Appl. No.: 540,900

[22] Filed: Jun. 20, 1990

[51] Int. Cl.⁵ .............................................. G01R 1/06
[52] U.S. Cl. ................................ 324/158 P; 324/72.5
[58] Field of Search .................. 324/158 P, 72.5, 133, 324/149; 439/482

[56] References Cited

U.S. PATENT DOCUMENTS

| | | | |
|---|---|---|---|
| 3,201,746 | 8/1965 | Askew | 324/72.5 |
| 3,646,579 | 2/1972 | DiVita et al. | 324/72.5 |
| 3,768,005 | 10/1973 | Louks | 324/133 |
| 4,001,679 | 1/1977 | Cargile et al. | 324/72.5 |

*Primary Examiner*—Ernest F. Karlsen
*Attorney, Agent, or Firm*—Herbert M. Shapiro

[57] ABSTRACT

An electrical probe includes an electrically conductive member free to move in an electrically insulating shaft. The member is secured to the shaft at the proximal end by a resilient loop. The probe is held between the thumb and the forefinger so that the thumb presses against the loop. When the thumb is pressed against the forefinger, the loop is compressed and the member is extended down the shaft and beyond to the desired test position. The probe may include a hook at the distal end of the extendable member to grasp a wire or component for testing.

6 Claims, 3 Drawing Sheets

ELECTRICAL TEST PROBE

FIELD OF THE INVENTION

This invention relates to electrical test probes and, more particularly, to such probes that are adapted for testing in cramped spaces common to electronic circuitry.

BACKGROUND OF THE INVENTION

Electrical test probes are common articles of commerce as is well known. The most common of these are probes which require two fingers and a thumb for operation. In the manner of a syringe, the fingers hold the probe and the thumb is used to extend the probe to the desired test position. As electronic circuitry becomes increasingly smaller and less accessible, probes of this type become less useful.

BRIEF DESCRIPTION OF AN ILLUSTRATIVE EMBODIMENT OF THIS INVENTION

In accordance with the principles of this invention, an electrical probe includes an insulating shaft in which a test probe is free to move. The probe is connected to the proximal end of the shaft with a resilient loop. The proximal end of the shaft is held between the thumb and the forefinger so that the thumb is against the loop. When the thumb and forefinger are squeezed together, the loop is depressed and the probe is extended down the shaft and beyond to a selected test position. The probe may include a hook at it's distal end to grasp a wire or component for testing.

DETAILED DESCRIPTION OF AN ILLUSTRATIVE EMBODIMENT OF THIS INVENTION

Figure 1:
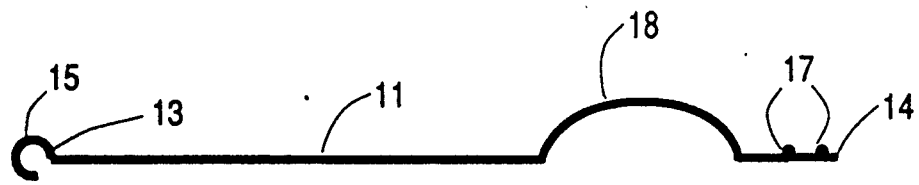
FIGS. 1 and 2 are side and top views of an electrically-conducting element of a probe in accordance with the principles of this invention.

FIG. 1 shows a side view of an electrical conducting element 11 for a probe in accordance with the principles of this invention. The conducting element typically comprises a resilient metal component having a distal end 13 and a proximal end 14. The distal end is shown, illustratively, as having a hook shape as indicated at 15. The proximal end is shown as having a pair of bosses 17 to anchor the proximal end as will become clear. Resilient component 11 has an arched or loop shaped area 18 close to it's proximal end.

Figure 2:
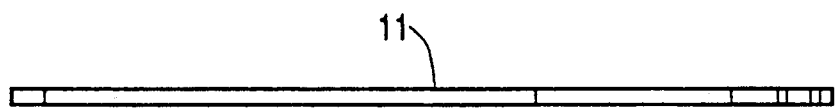
Figure 3:
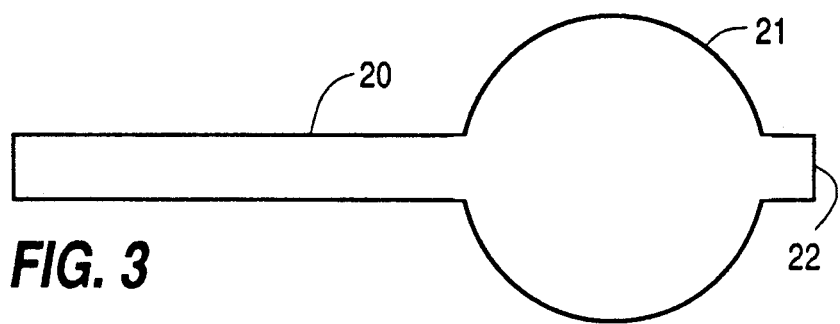
FIGS. 3, 4, and 5 are bottom, top and side views, respectively, of an extended, rigid, plastic member for receiving the component of FIGS. 1 and 2.
Figure 4:
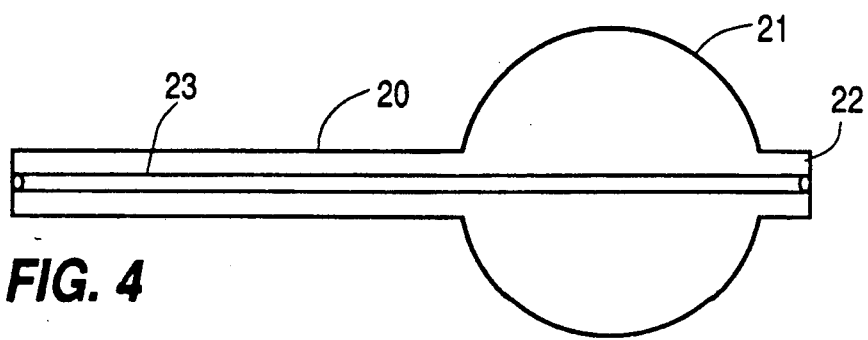
Figure 5:
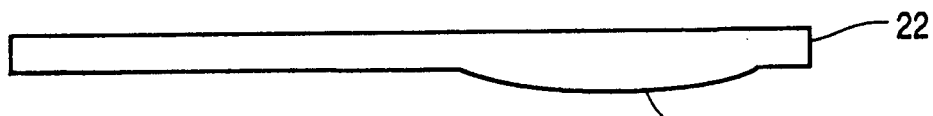

FIG. 2 shows a top view of component 11. The component can be seen to be regular in shape. The component resides in a shaft formed by a pair of electrically insulating plastic members which are placed in juxtaposition. FIGS. 3, 4, and 5 show bottom, top and side views of a first of these members. FIG. 3 shows a bottom view of an extended plastic, rigid member 20 having a generally rectangular shape with a circular region 21 near it's proximal end 22. Member 20 has a slot 23 formed in it as shown in FIG. 4. The slot is dimensioned to receive component 11 of FIG. 1. FIG. 5 shows the side view of member 20 with enlarged area 24 formed near the proximal end.

Figure 6:
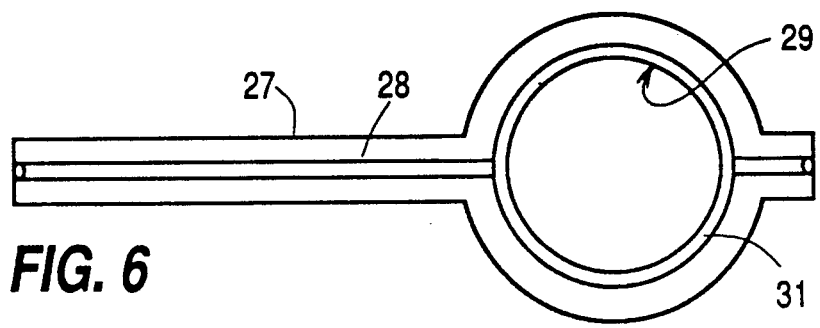
FIGS. 6, 7, and 8 are bottom, top and side views, respectively, of an extended plastic member for mating with the member of FIGS. 3, 4, and 5.
Figure 7:
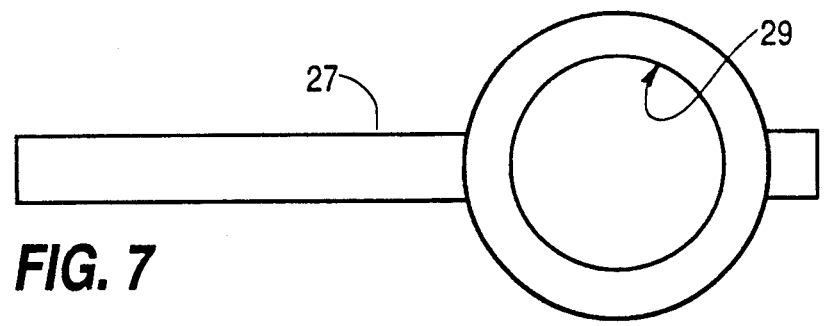
Figure 8:
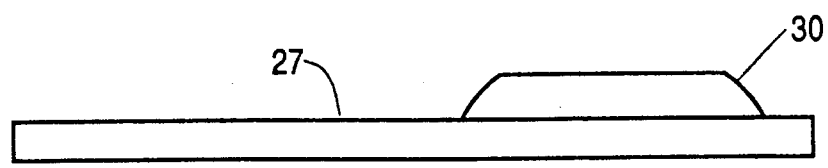

FIGS. 6, 7, and 8 show bottom, top, and side views of a member 27 which mates with member 20. As can be seen in FIG. 6, member 27 also has a slot (28) formed in it. When mated, members 20 and 27 have their respective slots aligned with one another to define a shaft in which component 11 resides.

FIGS. 6 and 7 show a circular opening 29 which corresponds in position to area 21 of FIGS. 3 and 4. Opening 29 is provided for arched or loop area 18 of FIG. 1 which protrudes upwards from the plane of the shaft in which component 11 resides.

Figure 9:
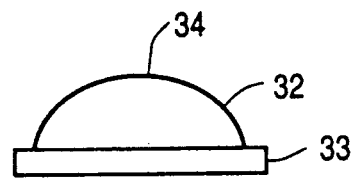
FIGS. 9, 10, and 11 are side and bottom views of a button for connection to the member of FIGS. 6, 7, and 8.
Figure 10:
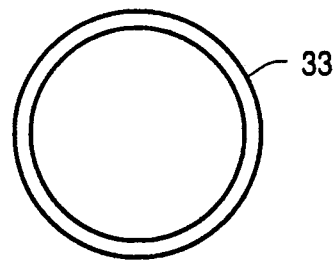
Figure 11:
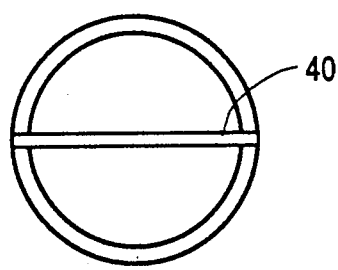

FIG. 8 shows a raised area 30 that corresponds to opening 29. The raised area has an annular area 31 adapted to receive a lip of a button shown in FIGS. 9, 10, and 11. FIG. 9 specifically shows a button 32 with a lip 33. Lip 33 is a circular lip extending beyond the button and seating into the annular area when the button is set into place with the hemispherical portion 34 of the button extending through opening 29 shown in FIGS. 6 and 7. FIGS. 10 and 11 show the underside of button 32. The underside of button 32 can be seen also to include a slot (40) into which loop area 18 is set.

The test probe in operation is grasped with the thumb resting against the hemispherical portion 34 of the button as shown in FIG. 9 and the forefinger resting against area 24 of FIG. 5. When the thumb and forefinger are squeezed together, loop area 18 is pressed downward, as viewed in FIG. 1, and the distal end of component 11 is moved to the left as viewed in FIG. 1.

Figure 12:
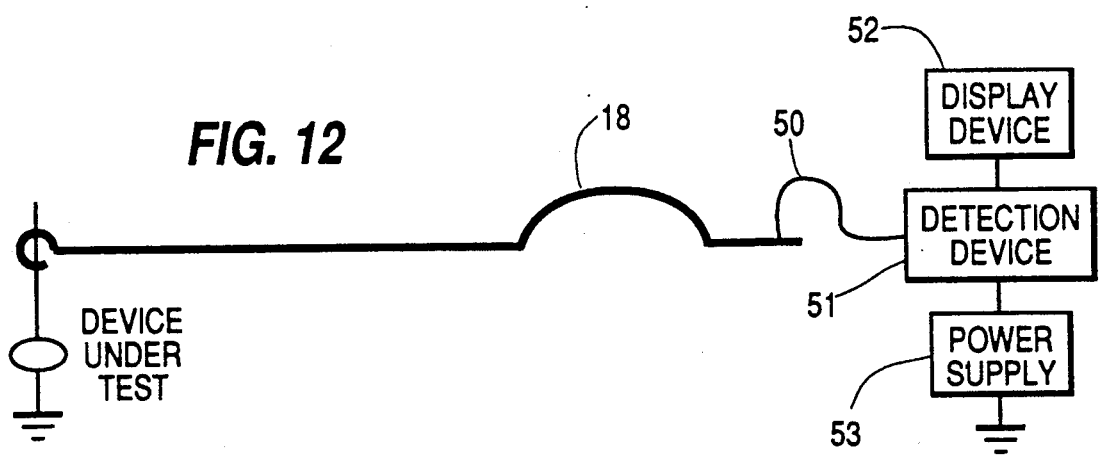
FIG. 12 is a schematic view of the probe of FIGS. 1 through 11 connected for test operation.

FIG. 12 is a schematic representation of the test probe in operation. The test probe is connected, by wire 50, at it's proximal end to a detection device which may comprise a voltmeter 51. The voltmeter is connected to a display device 52 which may comprise a standard digital read out. The display is connected to power supply 53. In operation, the loop 18 is depressed to extend component 11 so that hook 15 can grasp wire or component for testing as indicated in FIG. 12. Detection device 51 and display 52 are small and can be housed within the probe itself.

What is claimed is:

1. An electrical probe, said probe including an electrically-insulating housing for defining a shaft, said housing having proximal and distal ends, an electrically conducting member residing in said shaft, said member being anchored to said housing at it's proximal end and having a resilient loop extending out of the axis of said shaft near it's proximal end, means for applying a force perpendicular to the axis of said shaft to cause said loop to move towards a straight configuration when squeezed in a direction toward said shaft, said member being free to move in said shaft when said means is squeezed between a thumb and finger towards a flat configuration, said member being of a length with respect to the length of said shaft to extend beyond said shaft at said distal end when said means is squeezed for contacting a component for testing, said loop resuming a loop configuration when released.

2. A probe as set forth in claim 1 wherein said member includes a hook at said distal end.

3. A probe as set forth in claim 1 including means responsive to a signal from said component for detecting the presence or absence thereof.

4. A probe as set forth in claim 3 also including means for displaying the presence and absence of said signal.

5. A probe as set forth in claim 1 including first and second relatively flat electrically insulating members each having a slot formed therein and having a proximal and distal end, each of said members having a circular portion near said proximal end, said members being in juxtaposition with said slots opposing to define said shaft therebetween, said first member having said circular portion near said proximal end in the shape of an open ring, said resilient loop extending upwards through said open ring, said probe including a button set into said open ring for compressing said loop when said button is depressed.

6. A probe as set forth in claim 5 wherein the distal ends of said insulating members and said electrically conducting member coincide.

* * * * *